United States Patent
Zhang et al.

(10) Patent No.: US 10,743,111 B2
(45) Date of Patent: Aug. 11, 2020

(54) MEMS MICROPHONE

(71) Applicant: AAC ACOUSTIC TECHNOLOGIES (SHENZHEN) CO., LTD, Shenzhen (CN)

(72) Inventors: Rui Zhang, Shenzhen (CN); Jinyu Zhang, Shenzhen (CN); Ting Kang, Shenzhen (CN)

(73) Assignee: AAC Acoustic Technologies (Shenzhen) Co., Ltd., Shenzhen (CN)

( * ) Notice: Subject to any disclaimer, the term of this patent is extended or adjusted under 35 U.S.C. 154(b) by 0 days.

(21) Appl. No.: 16/236,516

(22) Filed: Dec. 30, 2018

(65) Prior Publication Data

US 2020/0100034 A1  Mar. 26, 2020

(30) Foreign Application Priority Data

Sep. 26, 2018  (CN) .................... 2018 2 1568139 U

(51) Int. Cl.
| | |
|---|---|
| *H04R 19/04* | (2006.01) |
| *H04R 19/00* | (2006.01) |
| *H04R 1/04* | (2006.01) |
| *B81B 3/00* | (2006.01) |

(52) U.S. Cl.
CPC ........... *H04R 19/04* (2013.01); *B81B 3/0072* (2013.01); *H04R 1/04* (2013.01); *H04R 19/005* (2013.01); *B81B 2201/0257* (2013.01); *B81B 2203/0127* (2013.01); *H04R 2201/003* (2013.01)

(58) Field of Classification Search
CPC ........ H04R 1/04; H04R 19/005; H04R 19/04; B81B 2201/0257; B81B 2201/0127; B81B 2201/003
See application file for complete search history.

(56) References Cited

U.S. PATENT DOCUMENTS

| | | | | |
|---|---|---|---|---|
| 2008/0019543 A1* | 1/2008 | Suzuki | ................ | H04R 19/005 381/174 |
| 2014/0084396 A1* | 3/2014 | Jenkins | ................ | B81B 3/0021 257/419 |
| 2015/0078593 A1* | 3/2015 | Uchida | ................ | H04R 19/005 381/191 |

* cited by examiner

*Primary Examiner* — Sunita Joshi
(74) *Attorney, Agent, or Firm* — IPro, PLLC; Na Xu

(57) ABSTRACT

An MEMS microphone is provided, including a base having a back cavity, and a capacitor system disposed on the base, the capacitor system including a backplate and a diaphragm disposed oppositely to the backplate. The diaphragm includes a body portion and a plurality of venting portions connected to the body portion, each of the plurality of venting portions includes a venting aperture penetrating through the diaphragm and a membrane flap partially fixed to the diaphragm and located in the venting aperture. The MEMS microphone further includes an insulation connecting pillar having one end fixedly connected to the backplate and another end fixedly connected to the membrane flap. Compared with the related art, the venting portion is fixedly connected to the backplate through the insulation connecting pillar, so that the venting portion is not easily warped, thereby improving reliability of the MEMS microphone.

7 Claims, 4 Drawing Sheets

MEMS MICROPHONE

CROSS-REFERENCE TO RELATED APPLICATIONS

The present application claims priority to Chinese Patent Application No. 201821568139.6, filed on Sep. 26, 2018, the content of which is incorporated herein by reference in its entirety.

TECHNICAL FIELD

The present disclosure relates to the field of electroacoustic conversion, and in particular, to a MEMS microphone.

BACKGROUND

In recent years, mobile communication technologies have been rapidly developed, and consumers are increasingly using mobile communication devices, such as portable phones, portable phones with Internet access, personal digital assistants, or other devices that communicate with a dedicated communication network, among which a microphone is an important component, especially a MEMS microphone.

A Micro-Electro-Mechanical System (MEMS) microphone is an electroacoustic transducer manufactured by micro-machining technology, which has the characteristics of small volume, good frequency response and low noise, etc. With the development of small and light electronic devices, MEMS microphones are increasingly applied in these devices.

A MEMS microphone in the related art includes a base having a back cavity, and a capacitor system disposed on the base. The capacitor system includes a backplate and a diaphragm disposed opposite to the backplate. However, during the vibration process of the diaphragm, the air between the backplate and the diaphragm cannot be discharged as soon as possible, thereby affecting the performance of the MEMS microphone.

Therefore, it is necessary to provide an improved MEMS microphone to solve the above problems.

BRIEF DESCRIPTION OF DRAWINGS

In order to illustrate technical solutions in embodiments of the present disclosure, the accompanying drawings used in the embodiments are introduced as follows. It should be noted that the drawings described as follows are merely part of the embodiments of the present disclosure, other drawings can also be acquired by those skilled in the art without paying creative efforts.

DESCRIPTION OF EMBODIMENTS

In order to make the purpose, technical solutions, and advantages of the embodiments of the present disclosure to be understandable, the technical solutions in embodiments of the present disclosure are described in the following with reference to the accompanying drawings. It should be understood that the described embodiments are merely exemplary embodiments of the present disclosure, which shall not be interpreted as providing limitations to the present disclosure. All other embodiments obtained by those skilled in the art without creative efforts according to the embodiments of the present disclosure are within the scope of the present disclosure.

Figure 1:
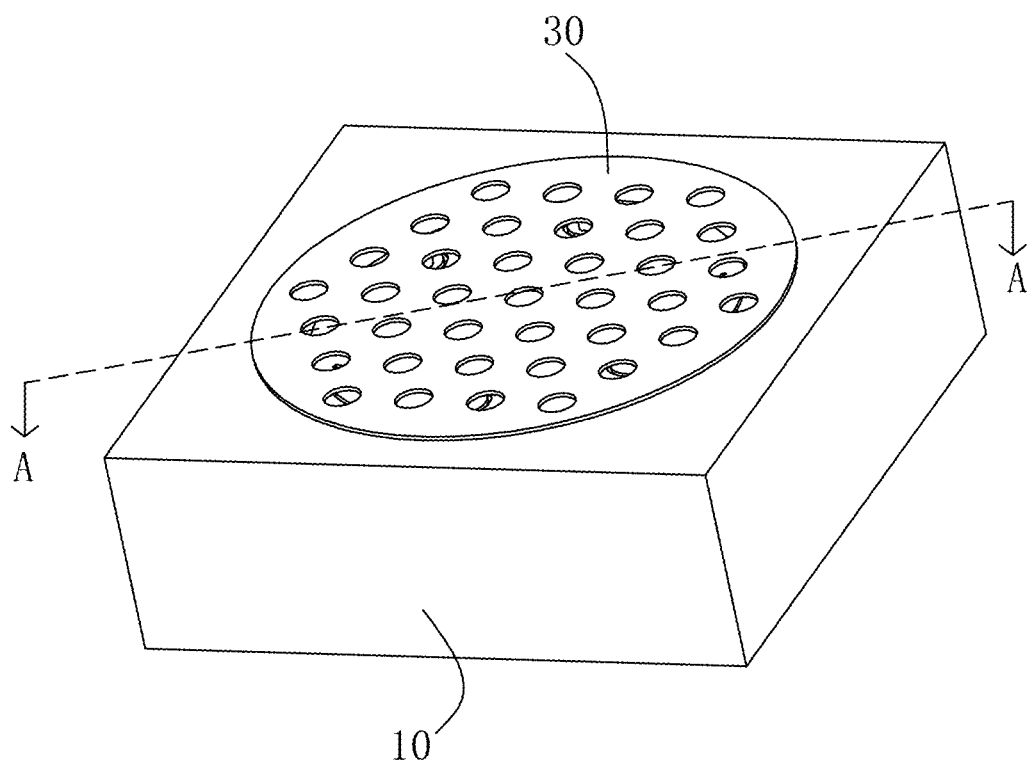
FIG. 1 is a schematic perspective view of a MEMS microphone according to an embodiment of the present disclosure.
Figure 2:
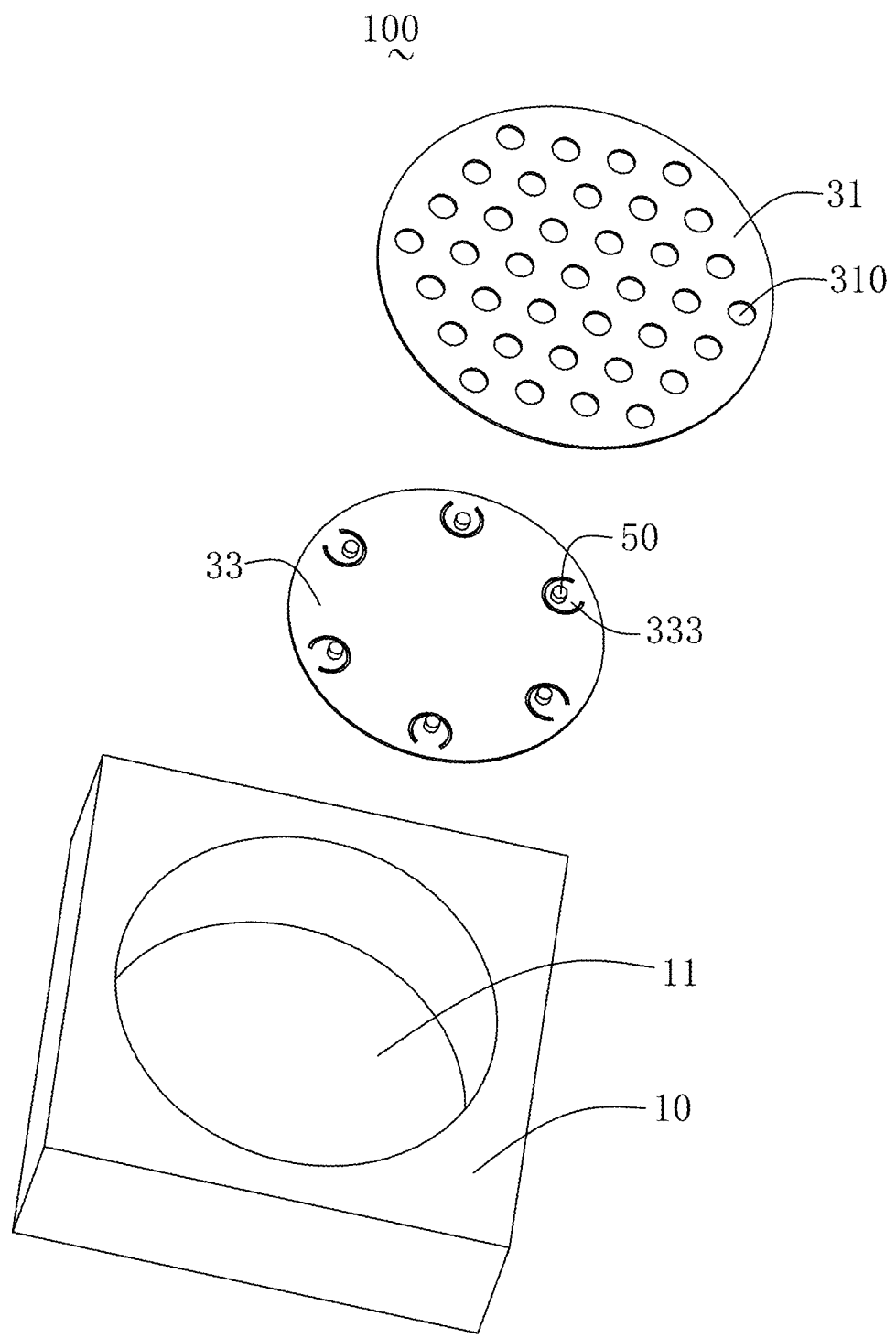
FIG. 2 is an exploded view of a MEMS microphone according to an embodiment of the present disclosure.
Figure 3:
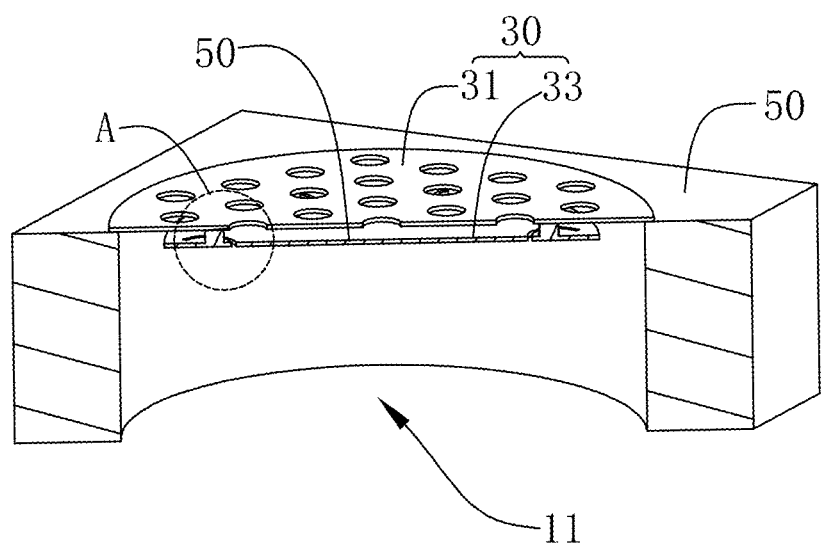
FIG. 3 is a cross-sectional view of FIG. 1.

With reference to FIGS. 1-3, in an embodiment of the present disclosure, a MEMS microphone 100 includes a base 10 having a back cavity 11, a capacitor system 30 disposed on the base 10, and an insulation connecting pillar 50 disposed in the capacitor system. The capacitor system 30 is connected to and insulated from the base 10.

The base 10 is made of a semiconductor material, such as silicon.

The back cavity 11 penetrates through the base 10.

In one embodiment, the back cavity 11 may be formed by a bulk-silicon micromachining process or etching.

The capacitor system 30 includes a backplate 31 and a diaphragm 33 disposed in parallel to and spaced from the backplate 31. The backplate 31 is fixed onto the base 10 and is provided with sound apertures 310. The diaphragm 33 is located at a side of the backplate 31 close to the base 10. The diaphragm 33 has an area smaller than an aperture area of the back cavity 11 and is disposed in the back cavity 11, so that the internal space of the MEMS microphone is fully utilized, which is advantageous for miniaturization of the MEMS microphone.

The backplate 31 is spaced from the diaphragm 33 to form a sounding cavity 35.

The backplate 31 and the diaphragm 33 are both conductors.

In one embodiment, the backplate 31 and the diaphragm 33 are both made of polysilicon doped or single crystal silicon doped conductive material.

In the MEMS microphone 100 is energized for operation, the backplate 31 and the diaphragm 33 are charged with opposite polarities to form the capacitor system 30. When the diaphragm 33 vibrates under sound waves, the distance between the diaphragm 33 and the backplate 31 changes, causing the capacitance of the capacitor system 30 to change, thereby converting the sound wave signal into an electrical signal, and thus achieving the corresponding function of the microphone.

Figure 4:
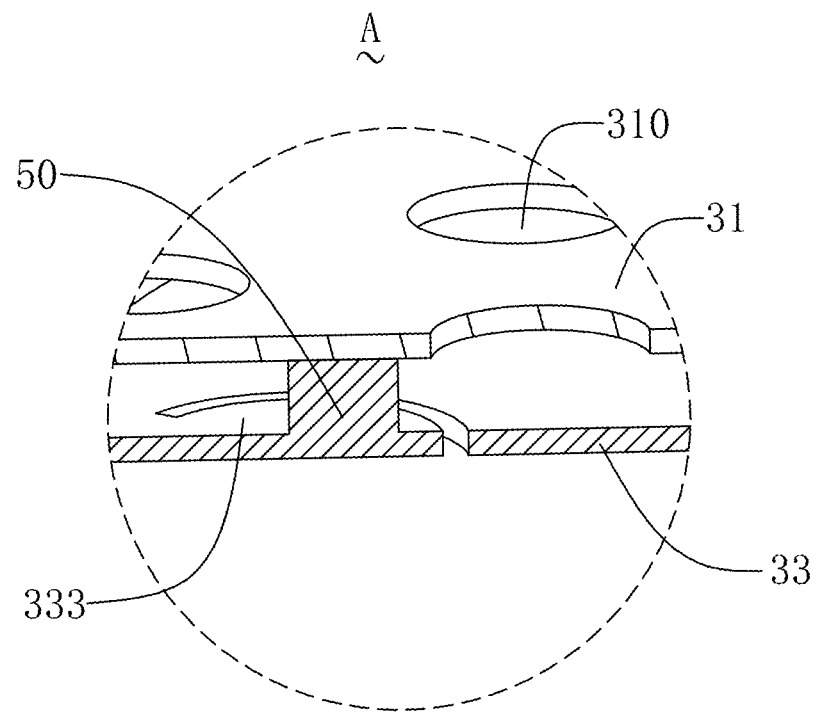
FIG. 4 is an enlarged view of a region A of FIG. 3.
Figure 5:
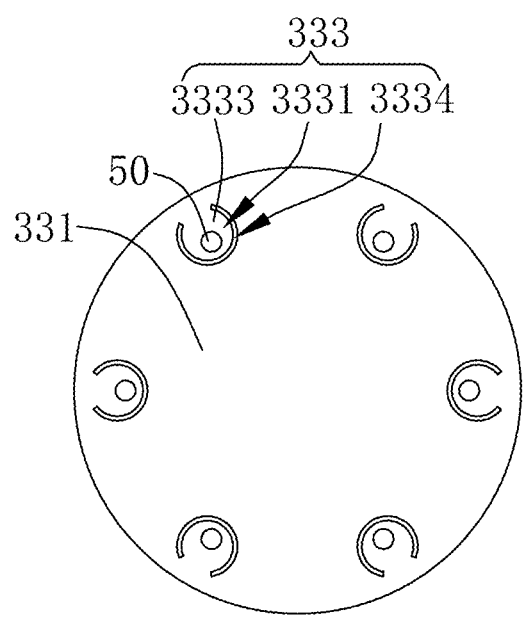
FIG. 5 is a schematic structural view of a diaphragm and an insulation connecting pillar according to an embodiment of the present disclosure.

With reference to FIG. 4 and FIG. 5, the diaphragm 33 includes a body portion and venting portions 333 distributed along an edge of the body portion 331. Herein, the venting portions 333 make the acoustic cavity 35 be in communication with the back cavity 11.

When the diaphragm 33 encounters a strong airflow, the venting portions 333 allow the airflow to quickly pass through the diaphragm 33, thereby avoiding the risk of breaking the diaphragm 33.

In one embodiment, six venting portions 333 are provided, and the six venting portions 333 are disposed spaced from one another, and are distributed in an annular array.

Each venting portion 333 includes a venting aperture 3331 penetrating through the diaphragm 33 and a membrane flap 3333 coving the venting aperture 3331.

When the diaphragm 33 encounters a strong airflow, the diaphragm 33 is deformed under the airflow, and a gap is formed between the diaphragm 33 and the membrane flap 3333, so that the venting aperture 3331 opens, and the airflow passes through the diaphragm 33 from the venting aperture 3331.

In this embodiment, a portion of a periphery of the membrane flap 3333 is fixed to the diaphragm 33, and another portion of the membrane flap 3333 not fixed to the diaphragm 33 is provided with a slit 3334. The slit 3334 has a circular arc shape. When the diaphragm 33 encounters an airflow and is deformed, the venting aperture 3331 is opened by the 3334. It is appreciated that, the fixing manner of the membrane flap 3333 is not limited to a portion being fixed to the diaphragm 33, and it is also possible that the periphery of the membrane flap 3333 is fixed to the diaphragm 33, and a slit (shaped as "+", "−", or "Y" etc.) is arranged in the central region of the membrane flap 3333.

The insulation connecting pillar 50 has one end fixedly connected to the backplate 31, and another end fixedly connected to the membrane flap 3333, so that the membrane flap 3333 is fixed, thereby preventing the membrane flap 3333 from being warped when the airflow flows through the venting aperture 3331.

The insulation connecting pillar 50 is disposed perpendicular to the backplate 31.

In one embodiment, six insulation connecting pillars 50 are provided, and the six insulation connecting pillars 50 are disposed in one-to-one correspondence to the six venting portions 333.

In one embodiment, the insulation connecting pillar 50 is made of a non-conductive material, and does not affect the capacitor system 30 when the MEMS microphone 100 is energized for operation.

In this embodiment, the insulation connecting pillar 50 has a circular cross section. The cross section herein is along a direction shown in FIG. 2. It is appreciated that, in other embodiments, the cross section of the insulation connecting pillar 50 may be square or any other shape.

Compared with the related art, the MEMS microphone 100 of the present disclosure provides the insulation connecting pillar 50, and the venting portion 333 is fixedly connected to the backplate 31 through the insulation connecting pillar 50, so that the venting portion 333 is not easily warped, thereby avoiding a low degradation, and thus improving the reliability of the MEMS microphone 100. The membrane flap 3333 is connected to the insulation connecting pillar 50, so that the venting aperture 3331 can be opened by moving the diaphragm 33 up or down when a strong airflow is encountered, and thus the airflow can flow out from the venting aperture 3331. In this way, the probability of breaking the diaphragm 33 is reduced, and the membrane flap 3333 is not easily warped, thereby improving the stability of the MEMS microphone 100.

It should be noted that, the described embodiments are merely exemplary embodiments of the present disclosure, which shall not be interpreted as providing limitations to the present disclosure. All other embodiments obtained by those skilled in the art without creative efforts according to the embodiments of the present disclosure are within the scope of the present disclosure.

What is claimed is:

1. A micro-electro-mechanical system (MEMS) microphone, comprising:
   a base having a back cavity,
   a capacitor system disposed on the base, the capacitor system comprising a backplate and a diaphragm disposed oppositely to the backplate, and
   a plurality of insulation connecting pillars;
   wherein the diaphragm comprises a body portion, a plurality of venting apertures penetrating through the body portion and a plurality of membrane flaps, each membrane flap is located in a respective one of the venting apertures and partially fixed to the body portion, each insulation connecting pillar connects the backplate and a respective one of the membrane flaps for supporting the body portion, the body portion is moveable relative to the membrane flaps.

2. The MEMS microphone according to claim 1, wherein the backplate is fixed to the base, and the diaphragm is located on a side of the backplate close to the base.

3. The MEMS microphone according to claim 2, wherein the diaphragm is located in the back cavity, and has an area smaller than an aperture area of the back cavity.

4. The MEMS microphone according to claim 1, wherein the plurality of venting apertures is arranged on an edge of the diaphragm.

5. The MEMS microphone according to claim 1, wherein the plurality of venting apertures is spaced apart from one another and distributed in an annular array.

6. The MEMS microphone according to claim 1, wherein each insulation connecting pillar is perpendicular to the backplate.

7. The MEMS microphone according to claim 1, wherein each insulation connecting pillar has a circular or square cross section.

* * * * *